United States Patent [19]

Maejima

[11] 3,906,195

[45] Sept. 16, 1975

[54] SYNCHRONOUS MULTI-PURPOSE COUNTER

[75] Inventor: Tsugie Maejima, Gyoda, Japan

[73] Assignee: Takeda Riken Kogyo Kabushikikaisha, Tokyo, Japan

[22] Filed: Jan. 30, 1974

[21] Appl. No.: 438,046

[30] Foreign Application Priority Data

Feb. 9, 1973 Japan ............................ 48-16176

[52] U.S. Cl...... 235/92 LG; 235/92 EV; 235/92 SH; 235/92 R; 307/222

[51] Int. Cl.[2] .................. H03K 23/08; H03K 21/06

[58] Field of Search ...... 235/92 LG, 92 GT, 92 EV, 235/92 SH; 307/222

[56] References Cited

UNITED STATES PATENTS

| | | | |
|---|---|---|---|
| 2,816,223 | 12/1957 | Nelson | 235/92 GT |
| 2,853,238 | 9/1958 | Johnson | 235/92 GT |
| 3,114,883 | 12/1963 | Arthur | 235/92 GT |
| 3,121,787 | 2/1964 | Bordelon | 235/92 LG |
| 3,544,773 | 12/1970 | Peddie | 235/92 LG |
| 3,564,218 | 2/1971 | Lay | 235/92 LG |
| 3,588,461 | 6/1971 | Halsall | 235/92 LG |

*Primary Examiner*—Joseph M. Thesz, Jr.
*Attorney, Agent, or Firm*—Sughrue, Rothwell, Mion, Zinn and Macpeak

[57] ABSTRACT

A synchronous multi-purpose counter is provided including a plurality of counter stages. Each stage comprises J-K flipflop, for example, at least two operational gates and a switching gate. The second and subsequent stages are each additionally associated with an auxiliary gate. In each of the counter stages, the output of the plurality of operational gates is connected with the J input terminal of the flipflop while the switching gate is opened by a signal representing other than a counting operation for supplying an inverted signal of the input signal to the J input terminal to the K input terminal. A counting operation signal opens the auxiliary gate associated each counter stage to supply a signal of the same polarity as the input signal to the J input terminal to the K input terminal. The flipflop of each stage has a clock terminal C which is supplied with a clock signal. In an addition or up-counting operation, the output from the Q output terminal of each flipflop is supplied to the operational gate in all of subsequent stages which is opened by an addition operation signal. During a subtraction or down-counting operation, the output from the Q output terminal of each flipflop is supplied to the operational gate in all of subsequent stages which is opened by a subtraction operation signal. In a presetting operation, a preset operation signal opens an operational gate associated with each counter stage to supply data which is to be entered into that stage to the J input terminal thereof. In an advance shift register operation, the output from the Q output terminal of each flipflop is supplied to the operational gate associated with the next stage which is opened by a shift register operation signal. When producing a complement data, the output from the Q output terminal of a flipflop is supplied to the operational gate of that stage which is opened by a complementing operation signal.

13 Claims, 9 Drawing Figures

SYNCHRONOUS MULTI-PURPOSE COUNTER

BACKGROUND OF THE INVENTION

The invention relates to a synchronous multipurpose counter which operates on the basis of a clock signal.

A conventional reversible counter which operates to count clock pulses and in which a desired value can be initially entered is incapable of operations other than the counting operation, such as for example, shift registor operation or complementing operation. Information processing systems according to various digital schemes require reversible counters and shift registors, and often also require obtaining a complement data. In order to accommodate for these functions, it has been the practice to provide devoted components performing specific functions separately, or a buffer registor has been associated with the counter to provide the function of a shift registor or the function to obtain a complement data, resulting in a complex and expensive arrangement. Where a buffer registor is provided to enable the counter to function in a manner other than the counting function, there has been a drawback of reduced overall operating frequency in addition to the complex arrangement.

When presetting a conventional reversible counter to a given data, the data is supplied to the set terminal of a corresponding flipflop independently from the clock signal, so that there has been a risk of skew, namely, the counter output may be out of phase with respect to the clock period when changing from the counting operation to data presetting or vice versa. With a counter which may be subject to such a skew, it is difficult to provide a communication with its peripheral circuits on the real time basis.

It is an object of the invention to provide a synchronous multi-purpose counter capable of at least one of the shift registor operation and complementing operation in addition to the counting operation.

It is another object of the invention to provide a synchronous multi-purpose, presettable reversible counter which is also capable of either shift registor operation or complementing operation.

It is a further object of the invention to provide a synchronous multi-purpose counter which can be used to simplify a digital information processing system.

It is an additional object of the invention to provide a synchronous multi-purpose counter in which the period of an output data is synchronized with the period of a counting clock when changing from the counting operation to other operations or vice versa.

It is still another object of the invention to provide a synchronous multi-purpose counter capable of performing operations other than the counting operation and which lends itself to provide a communication of data with its peripheral circuits on the real time basis.

It is a still further object of the invention to provide a synchronous multi-purpose counter capable of performing operations other than the counting operation without requiring an additional buffer registor, thus avoiding the limitation on the operating speed imposed thereby and thus enabling a high speed operation.

SUMMARY OF THE INVENTION

In accordance with the invention, each counter stage comprises a J-K flipflop, for example, having a first input terminal J which is connected with a plurality of operational gates. Each counter stage also has a second input terminal K to which the same input signal as that applied to the first input terminal can be supplied through a switching gate. The output from the output terminal of each flipflop can be supplied to the first input terminal of the next stage through a gate associated with the latter. The second input terminal of the second and subsequent counter stages can be supplied with the output from a preceding stage through an auxiliary gate. In the counting operation, the auxiliary gate is opened to supply a same input to the first and second input terminals. In operations other than the counting operation, the auxiliary gate is closed while the switching gate is opened so that the first and second input terminals of each stage receive inputs of different polarities. The flipflop of each stage also has a clock terminal to which a clock signal is applied. The counting operation is enabled when a given operational gate is opened, and for operations other than the counting operation, a corresponding operational gate is opened to permit a shift registor operation or data entry by clock signals applied to the clock terminal. Those of the operational gates connected with the first input terminal which is used during an operation other than the counting operation is supplied with data corresponding to the intended operation. Any operation takes place in terms of a clock signal applied to the clock terminal, thereby precluding an oscillation, setting all of the stages into an identical data, or the occurrence of a skew.

BRIEF DESCRIPTION OF THE DRAWINGS

FIGS. *3a–f* are timing charts for illustrating the operation of the counter of FIG. 2.

DETAILED DESCRIPTION OF THE INVENTION

Figure 1:
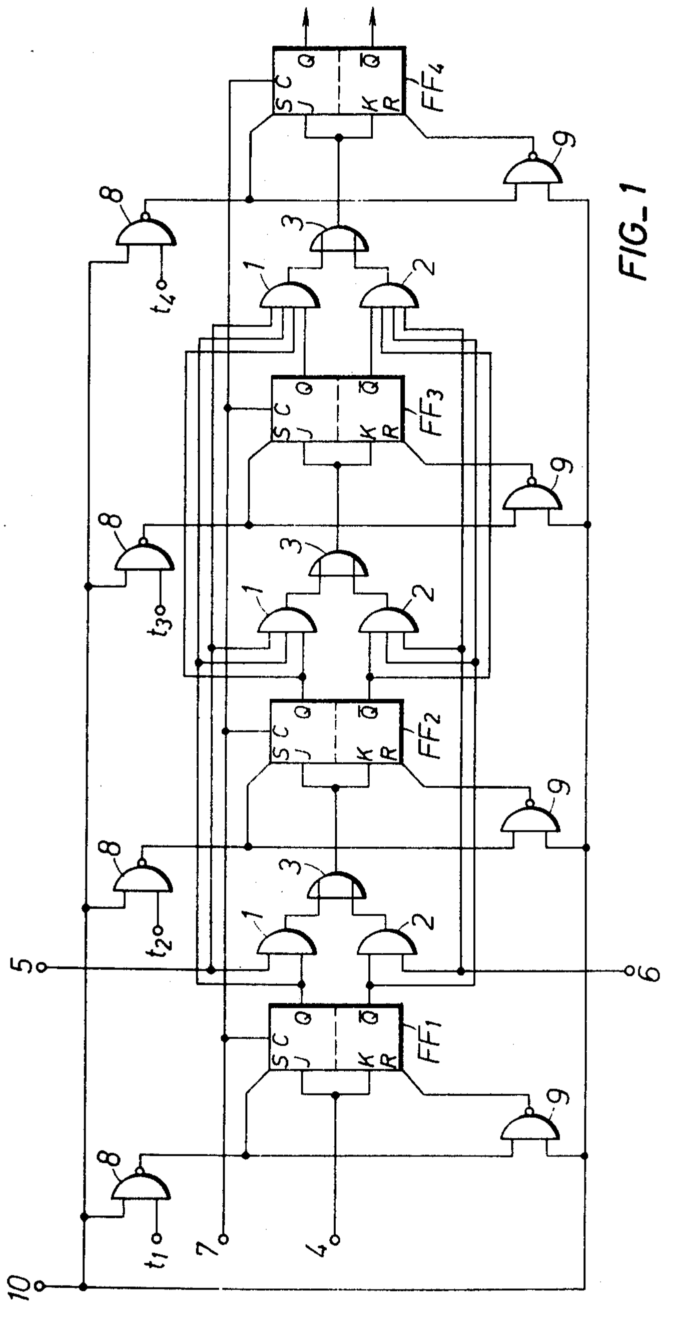
FIG. 1 is a block diagram of a conventional presettable, reversible counter.

FIG. 1 shows a conventional reversible counter comprising first to fourth counter stages, each of which comprises a J-K flipflop $FF_1$, $FF_2$, $FF_3$ or $FF_4$. Each of the flipflops $FF_1$ to $FF_4$ produce complementary outputs at its output terminals Q and Q, which are supplied through respective gates 1 and 2 and through an OR circuit 3 to the input terminals J and K of the next stage. The input terminals J and K of the first stage flipflop $FF_1$ are connected with a terminal 4 which always supplies a voltage of logical 1 to these input terminals. When an addition signal is applied from a terminal 5 to the gate 1 associated with each stage, the respective gate 1 is opened to enable the counter for an addition or up-counting operation, while when a subtraction signal is applied from a terminal 6 to the gate 2, the counter is enabled for a subtraction or down-counting operation. Every time a clock signal from a terminal 7 is applied to the clock terminal C of each flipflop, one is added to or subtracted from the number represented by the content of the flipflops $FF_1$ to $FF_4$ depending upon whether the counter is enabled for an addition or a subtraction operation.

In order to permit an entry of any desired initial value into the counter, NAND gates 8 and 9 are associated with each stage, and data is supplied from data input terminals $t_1$ to $t_4$ to the respective gates 8 of the flipflops $FF_1$ to $FF_4$ while a preset clock is applied to a terminal 10. The preset clock is also supplied to each of the gates 9. The output from the gate 8 is applied to the set terminal S of the flipflop of the corresponding stage, and is also applied to another input of the gate 9. The output of the gate 9 is applied to the reset terminal R of the flipflop of the corresponding stage. In this manner, data supplied to the terminals $t_1$ to $t_4$ are entered into the flipflops $FF_1$ to $FF_4$ during the time the preset clock is applied to the terminal 10.

Thus it will be seen that in a conventional presettable, reversible counter, the entry of an initial value takes place by supplying data to the set terminal of the flipflop whereas the counting operation takes place by supplying clock signal to the clock terminal thereof, so that the interval between the output signals is indefinite at the beginning of a counting operation which follows such entry of an initial value. In other words, the counter was susceptible to the occurrence of "skew." To avoid this, it is necessary that the count clock applied to the terminal 7 and the preset clock applied to the terminal 10 be displaced in phase by a given amount or in a relation such that the trailing edge of the count clock coincides with the leading edge of the preset clock, thus requiring a two phase clock and resulting in a complex arrangement.

In a usual digital data processing system, it is often necessary to provide a shifting of data or to obtain a complementary data. Apparently it would be convenient if such operations could be performed by the counter described above. Considering the above counter for such operations, it is noted that a shift registor should shift data by one bit position successively, so that the content of the respective flipflops $FF_1$ to $FF_4$ would have to be supplied to the preset gates 8, 9 of the next following stage, respectively. However, because the presetting operation takes place during the duration of the preset clock applied to the terminal 10, the entry of data in the first stage $FF_1$ into the next stage $FF_2$ will result in the entry of data now established in $FF_2$ into the next following stage $FF_3$ because of the presence of the preset clock, and such entry or transfer will repeat itself until the last stage is reached, with consequence that all of the flipflops will be set to the content of the first stage $FF_1$. This means that such a reversible counter can not be used as a shift registor.

When a complementary data is desired, this would require the output from the Q output terminal of each stage to be supplied to the preset input terminal t of that stage. At this time, the output data from the Q output terminal will be set to its complementary data or to the output data from the Q output terminal, and this in turn results in a reversal of the content from the Q terminal, which is again applied to the gate 8 of that stage, resulting in a repeated reversal of the content from the Q output terminal to its original state. This again reverses the content from the Q terminal, which reversed content is supplied to the gate 8, thus repeating such reversal during the duration of the preset pulse and resulting in an oscillation and failure to obtain a complementary data.

Figure 2:
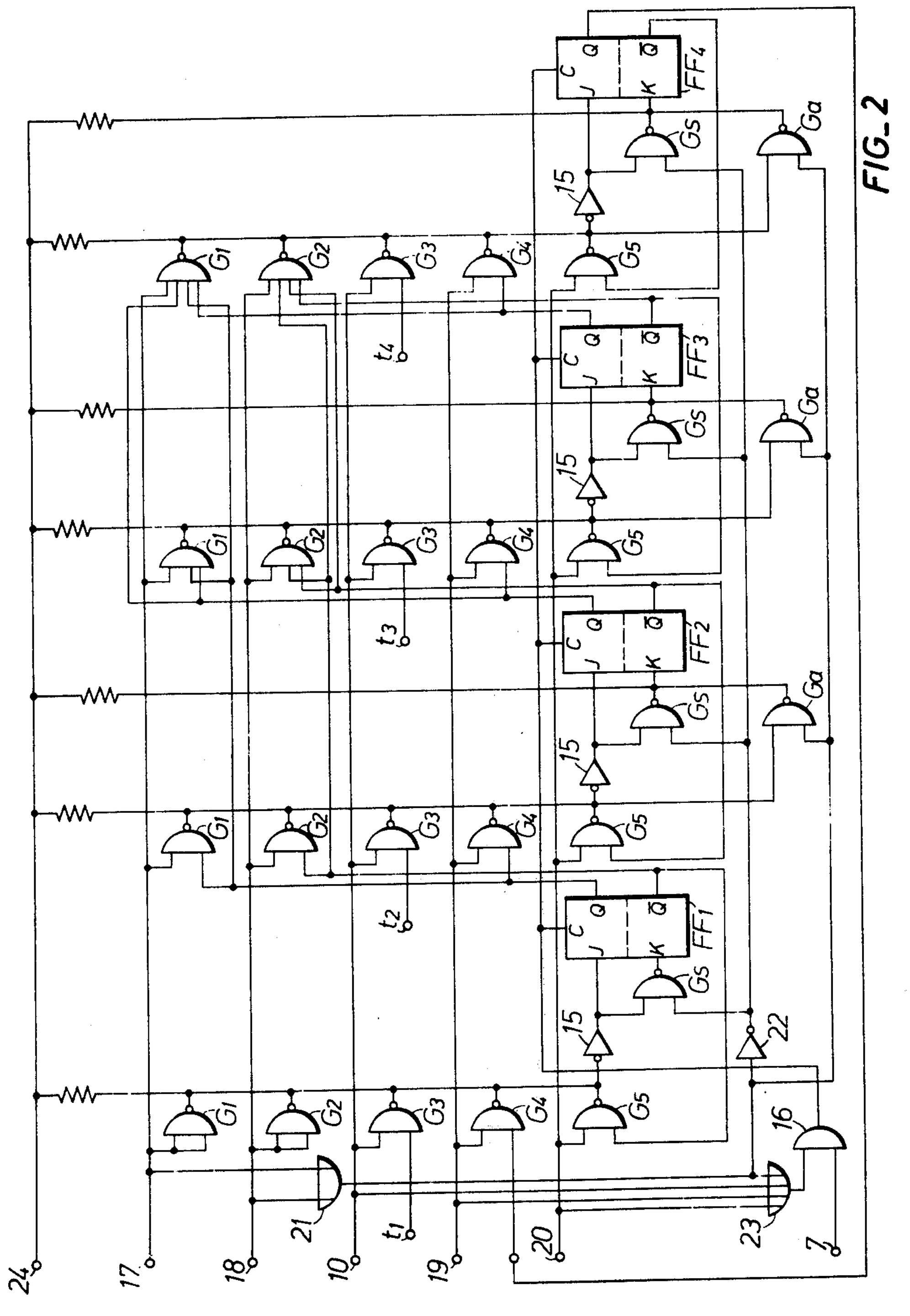
FIG. 2 is a block diagram of the synchronous multi-purpose counter according to one embodiment of the invention.

Referring to FIG. 2, the synchronous multipurpose counter according to one embodiment of the invention will be described below.

Reference characters $FF_1$ to $FF_4$ represent J-K flipflops which constitute counter stages, and their first input terminal J is connected with a plurality of operational gates. In the present example, each counter stage is associated with five NAND gates $G_1$ to $G_5$, the outputs of which are connected as a wired OR, the junction being connected to the first input terminal J of each flipflop FF through a negation circuit 15. Each counter stage is also associated with another NAND gate Gs which forms a switching gate and to which the input signal to the first input terminal J is supplied, the output of the switching gate being connected with the second input terminal K of the flipflop FF. The counter shown is arranged so as to be capable of both addition and subtraction operations by connecting the first and second output terminals Q and Q of the flipflop of each stage to one input of an addition operational gate $G_1$ and a subtraction operational gate $G_2$, respectively, of all subsequent stages.

The flipflops of the second and subsequent stages are also associated with an auxiliary gate Ga to which the output of the operational gates $G_1$ $G_2$ are respectively. The output of the auxiliary gate G*a* is connected with the second input terminal K of the same stage by a wired OR connection. The flipflops $FF_1$ to $FF_4$ have a clock terminal to which a clock signal from a terminal 7 is supplied through an AND circuit 16. A signal for enabling an addition or up-counting operation is applied from a terminal 17 to the addition operational gate $G_1$ associated with each stage, while a signal for enabling a subtraction or down-counting operation is applied from a terminal 18 to the subtraction operational gate $G_2$ of each stage. For entering an initial value into the counter, each preset operational gate $G_3$ has its one input terminal connected so as to receive data while ite other input terminal is supplied with a data preset signal from a terminal 10. When operating the counter as a shift registor, the shift registor operational gate $G_4$ of each stage has its one input connected so as to receive the output from the output terminal Q of the immediately preceding counter stage while its other input is supplied with a shift operation signal from a terminal 19. It will be noted that the gate $G_4$ of the first stage is supplied with the output from the output terminal Q of the last stage. The complementing operational gate $G_5$ of each stage is provided in order to obtain a complementary signal, and its one input is connected to receive the output from the output terminal Q of the stage with which it is associated while its other input is supplied with a complementing signal from an input terminal 20.

When the counter is conditioned for the counting operation, the respective counting operation signals from the terminals 17 and 18 are supplied through an OR circuit 21 and a negation circuit 22 to one input of the gate G*s* of each stage as a gate signal, thereby closing the switching gate G*s*. Simultaneously, the output from the OR circuit 21 is supplied to one input of the gate Ga so as to open the auxiliary gate G*a* during the counting operation. It will be noted that signals of same sign are applied to the first and second input terminals J and K of each stage. In order to supply a clock signal to the clock terminal C during the respective operations the outputs from the terminals 10 and 17 to 20 are supplied through an OR circuit 23 to enable the AND circuit 16. Where the respective NAND gates $G_1$ to $G_5$, G*s* and G*a* are of an open collector type, an operating voltage B*cc* is applied through respective resistors to these gates from a power source terminal 24.

Figures 3A, 3B, 3C, 3D, 3E, 3F:
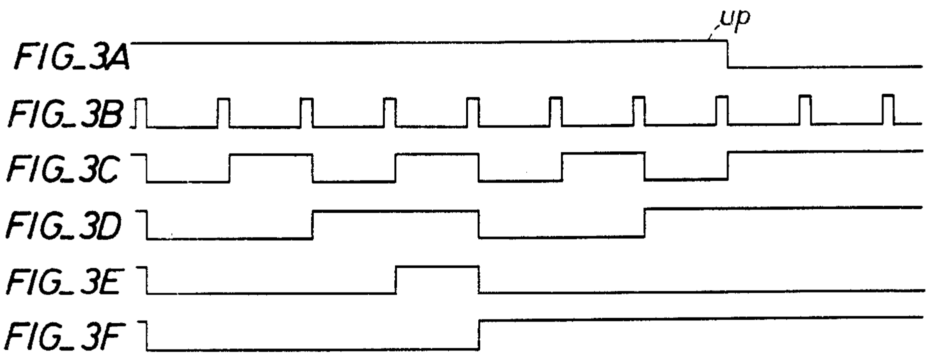

When operating the counter of the invention for and up-counting operation, an addition operation signal "up" as shown in FIG. 3A may be supplied to the terminal 17. Thereupon, the gate 16 is enabled, whereby a clock signal as shown in FIG. 3B is supplied to the clock terminal C of each flipflop FF. Also the gates $G_1$ and Ga are enabled, and in the first stage, the up-counting operation signal "up" is applied through the gate $G_1$ and the circuit 15 to the first input terminal J, this signal continuing to be applied as 1. The signal "up" is also applied through the OR circuit 21, negation circuit 22 and gate *Gs* to the second input terminal K as 1. As a consequence, every time a clock signal is applied, the output terminal Q of the flipflop $FF_1$ of the first stage reverses its status at the trailing edge of the clock as shown in FIG. 3C. This output Q is supplied to the gates $G_1$ associated with all of the second and subsequent stages, the outputs from these gates $G_1$ being supplied to the input terminals J and K of the associated stage through the negation circuit 15 and the auxiliary gate *Ga*, respectively. In a similar manner, the output from each stage is supplied to the input terminals J and K of the flipflops of the following stages. The resulting operation is similar to the up-counting operation in the counter shown in FIG. 1. The output from the first output terminal Q of the flipflop $FF_2$ of the second stage is shown in FIG. 3D, the output from the gates $G_1$ and *Ga* of the third stage is shown in FIG. 3E, and the output from the output terminal Q of the third stage is shown in FIG. 3F.

When operating the counter from a down-counting operation, a down-counting operation signal is applied to the terminal 18. In this instance, the gates $G_2$, *Ga* and 16 are enabled, and the output from the second output terminal Q of each stage is applied to the first and second input terminals J and K of all subsequent counter stages, resulting in the similar connection as achieved in FIG. 1 for a down-counting operation of the counter. Thus, the counter counts down every time a clock signal is applied thereto.

When presetting the counter or entering any desired initial value into the counter, the gating input terminals $t_1$ to $t_4$ of the respective stages are supplied with logical values corresponding to the respective bits of the initial value, and a preset signal is applied to the terminal 10. The preset signal has a duration comparable to one clock period, during which data applied to the terminals $t_1$ to $t_4$ are supplied to the first input terminal J of the flipflop FF of the corresponding stage through the respective gate $G_3$ and the negation circuit 15, while its complementary data is supplied to the second input terminal K through the gate *Gs*. As a consequence, each flipflop is set to the data applied to its input terminals J and K at the trailing edge of the clock signal during the interval of the preset signal, and the data preset in the respective flipflops are obtained at its output terminals Q and Q. It is to be noted that during operations other than the counting operation, the output of the OR circuit 21 assumes 0, so that the auxiliary gate *Ga* is closed while the output from the negation circuit 22 assumes 1 to enable the switching gate *Gs*. It will be noted that the input terminal K of each stage is supplied with an input which is complementary to the input to its input terminal J.

When operating the counter as a shift registor, a shift registor operation signal is applied to the terminal 19 to enable the shift registor operational Gate $G_4$ associated with each stage, whereby the output terminal Q of each stage is connected through the gate $G_4$ associated with the next stage and the data within the counter shifts by one bit position to the next higher stage for each clock signal applied to the terminal 7. It will be understood that by connecting the output terminal Q of each stage to one input of the gate $G_4$ associated with the immediately preceding stage, a shifting to the next lower stage can take place for each clock signal. In these shift operations, the shifting of data takes place instantaneously at the trailing edge of the clock signal, thus precluding that all of the stages assume the same content as the first or last stage.

When it is desired to obtain a complementary data, a signal having a duration corresponding to one clock period is applied to the terminal 20. Thereupon, the output from the second output terminal Q of each stage is applied to the first input terminal J of the same stage through the gate $G_5$ associated with this stage, and the counter stage is set to the new data at the trailing edge of the clock signal. In this manner, the counter obtains a new data which is complementary to the data which it had before the clock signal is applied. Again the change of the status in each stage takes place only at the trailing edge of the clock signal, so that an oscillation which may be caused by recirculation of a new data to its input can not occur.

It will be understood from the foregoing that the counter according to the invention can be used for a number of functions including an up-counting operation, a down-counting operation, a presetting of an initial value, a shift registor operation and a complementing operation. The counter operates on the same clock signal in either the counting operation or other operations, so that no skew can occur in the data when changing from the counting operation to other operations or vice versa, assuring delivery of data at an equal interval and facilitating the communication with the peripheral circuits on the real time basis. Because no buffer memory is required to effect operations other than the counting operation, a reduction in the operating speed is prevented.

It will be appreciated that the number of the operational gates $G_1$ to $G_5$ may be reduced to two so that the counter is only capable of either an up-counting or down-counting operation in combination with any another operation. The wired OR connection of the outputs of the operational gates simplifies the arrangement.

Figure 4:
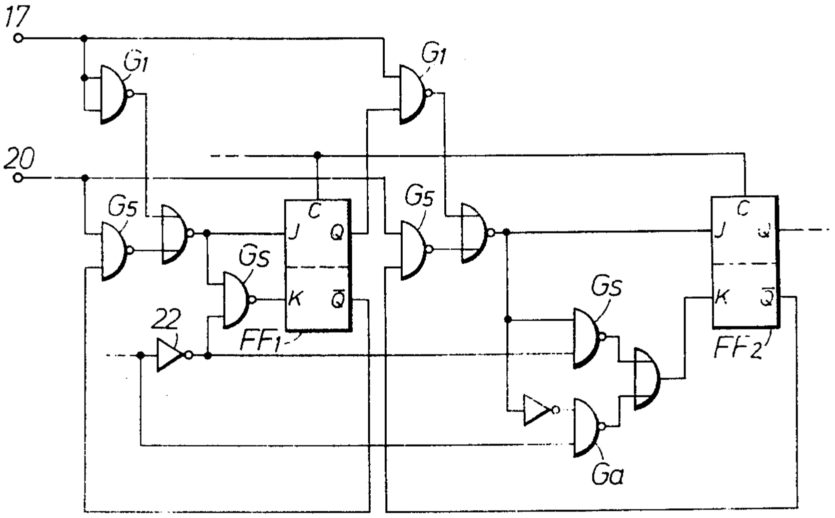
FIG. 4 is a block diagram of a modification of the synchronous multi-purpose counter according to the invention.

Alternatively, the number of the operational gates may be increased to more than five. Where the gates $G_1$ to $G_5$ which serve selecting a particular operation have their outputs ORed through an emittor coupled logical circuit, the operating speed can be increased higher than that achievable with the TTL arrangement. The wired OR connection of the gates $G_1$ to $G_5$ may be replaced by an NOR circuit shown in FIG. 4, and the inverter 15 may be omitted. FIG. 4 shows part of the circuit of FIG. 2 except the use of an NOR circuit, and corresponding parts are designated by like characters as used in FIG. 2 and therefore will not be described. While in the above description, each counter stage has been described as comprising a J-K flipflop, it may comprise any flipflop having first and second input terminals, at least one output terminal and a clock terminal and wherein the output reverses its status for each clock signal applied to its clock terminal when both the first and second input terminals have signals of same logical value and wherein when the first and second input terminals have signals of mutually different logical values, the flipflop is set to a status represented by the signals at its input terminals at the time the clock signal is applied. The switching gate *Gs* and the auxiliary gate *Ga* are used in a manner such that a signal of same logical value is applied to both the first and second input terminals during the counting operation while signals of mutually different logical values are applied to the first and second input terminals during the operations other than the counting operation. In a modification, the negation circuit 15 may also be omitted and the gates $G_1$ to $G_5$ may be replaced by an OR circuit. It will be understood that the number of counter stages is not limited to four, but may be increased or decreased as desired.

It will be understood that when the data preset in the counter of the invention is shifted forwardly by one bit position, this means the addition of 1 to the original data. Conversely, a shifting in the reverse direction by one bit position results in a subtraction of 1 from the original data. In the manner, it is possible to provide a multiplication or division by shifting a given number of bit positions in the forward or reverse direction. The data contained in the counter according to the invention can be processed together with a data contained in another registor in a data processing system for the purpose of an addition or subtraction or the like, and the result can be inputted into the counter of the invention. This would be of particular significance when the counter according to the invention is used as an address counter for a memory, for example, to permit the address to be jumped.

Having thus described the invention, what is claimed is:

1. A synchronous multi-purpose counter comprising a plurality of flipflops each having a first input terminal, a second input terminal, an output terminal and a clock terminal, each of the flipflops forming a counter stage, each flipflop having its status and the output at its output terminal reversed in logical value each time a clock signal is applied to its clock terminal when inputs to both its first and second input terminals have the same first logical value and having its previous status and the logical value at its output terminal maintained when the inputs have the same second logical value, the flipflop being set to a status represented by the relative logical values of its inputs when the inputs to its first and second input terminals have mutually different logical values; a like plurality of first gates each associated with the respective flipflops and having at least one input connected to receive the respective outputs from the flipflops of all of preceding stages and having its output connected to the first input terminal of the flipflop of its associated stage; a like plurality of second gates each associated with the respective flipflops and having its output supplied to the first input terminal of the associated flipflop; a like plurality of switching gates each associated with the respective flipflops for receiving the signal to the first input terminal of the associate stage as an input thereto and for supplying an inversion of the input to the second input terminal of the associated stage; a plurality of auxiliary gates associated with the respective flipflops except the first stage and having its input connected with the output of the corresponding first gate for supplying to the second input terminal of the associated flipflop the same signal as that supplied to the first input terminal of the same flipflop; a source of clock signal connected with the clock terminals of all of the flipflops in common; a source of first gate signal for enabling the first and auxiliary gates in a counting operation; and a source of second gate signal for enabling the second and switching gates in an operation other than the counting operation.

2. A synchronous multi-purpose counter according to claim 1 in which each of the second gates is supplied with a corresponding bit of data to be entered into the counter, and in which the second gate signal is a preset operation signal having a duration not greater than one clock period, the data supplied to the second gates being entered into the corresponding flipflops by a clock signal which occurs during the duration of the second gate signal.

3. A synchronous multi-purpose counter according to claim 1 in which each of the second gates is supplied with the output from the output terminal of the flipflop of the immediately preceding stage, said second gate signal being a forward shift registor operation signal.

4. A synchronous multi-purpose counter according to claim 1 in which each of the second gates is supplied with the output from the output terminal of the flipflop of the immediately following stage, the second gate signal being a reverse shift registor operation signal.

5. A synchronous multi-purpose counter according to claim 1 in which each of the second gates is supplied with an inverted output from the flipflop of the associated stage, the second gate signal being a complementing signal.

6. A synchronous multi-purpose counter according to claim 1 in which each of the flipflops has a second output terminal which provides an output of opposite polarity to the output from the first mentioned output terminal, each of the flipflops being associated with a subtraction gate having at least one input connected to receive the output from the second output terminal of the flipflops of all of its preceding stages and having its output connected with the first input terminal of the associated stage, the subtraction gate and the auxiliary gate being enabled by a subtraction gate signal.

7. A synchronous multi-purpose counter according to claim 1 in which the second gate comprises a plurality of gates, the plurality of second gates being supplied with either combination of a preset operation signal and data to be entered, a shift registor operation signal and the output from the flipflop of its adjacent stage, or a complementing signal and an inverted output from the flipflop of the associated stage.

8. A synchronous multi-purpose counter according to claim 1 in which the outputs of the first and second gates of each counter stage are coupled by a wired OR connection.

9. A synchronous multi-purpose counter according to claim 1, further including a NOR circuit which produces a logical sum of the outputs from the first and second gates of each counter stage and which applies its output to the first input terminal of the flipflop of the associated stage.

10. A synchronous multi-purpose counter according to claim 1, further including an inverter for receiving the outputs of the first and second gates of each counter stage and for supplying its output to the first input terminal of the flipflop of the associated stage.

11. A synchronous multi-purpose counter according to claim 1, further including a gate having one input connected to receive a clock signal and adapted to be enabled by either the first or second gate signal, the output of the gate being supplied to the clock terminal of the respective flipflop.

12. A synchronous multi-purpose counter according to claim 1 in which the outputs of the auxiliary gate and the switching gate of each counter stage are wired ORed and connected to the second input terminal of the flipflop of the associated stage.

13. A synchronous multi-purpose counter according to claim 1 in which the outputs of the auxiliary gate and the switching gate of each counter stage is connected through an OR circuit with the second input terminal of the flipflop of the associated stage.

* * * * *